US010665761B2

(12) United States Patent
Moteki et al.

(10) Patent No.: US 10,665,761 B2
(45) Date of Patent: May 26, 2020

(54) LIGHT WAVELENGTH CONVERSION MEMBER AND LIGHT EMISSION DEVICE

(71) Applicant: NGK SPARK PLUG CO., LTD., Nagoya-shi, Aichi (JP)

(72) Inventors: Jun Moteki, Seto (JP); Shohei Takaku, Komaki (JP); Yusuke Katsu, Komaki (JP); Takeshi Mitsuoka, Konan (JP); Tsuneyuki Ito, Aichi (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 16/328,161

(22) PCT Filed: Oct. 18, 2017

(86) PCT No.: PCT/JP2017/037679
§ 371 (c)(1),
(2) Date: Feb. 25, 2019

(87) PCT Pub. No.: WO2018/079373
PCT Pub. Date: May 3, 2018

(65) Prior Publication Data
US 2019/0198726 A1   Jun. 27, 2019

(30) Foreign Application Priority Data

Oct. 28, 2016 (JP) .................. 2016-211843
Oct. 12, 2017 (JP) .................. 2017-198555

(51) Int. Cl.
*H01L 33/50* (2010.01)
*H01L 33/16* (2010.01)
(Continued)

(52) U.S. Cl.
CPC .......... *H01L 33/504* (2013.01); *C04B 35/115* (2013.01); *C04B 35/117* (2013.01);
(Continued)

(58) Field of Classification Search
CPC ..... H01L 33/504; H01L 33/50; H01L 33/501; H01L 33/502; H01L 33/505
See application file for complete search history.

(56) References Cited

U.S. PATENT DOCUMENTS

2008/0187746 A1   8/2008   De Graaf et al.
2010/0229813 A1   9/2010   Ogata et al.
(Continued)

FOREIGN PATENT DOCUMENTS

EP   2 438 139 A1   4/2012
JP   5088977 B2     12/2012
(Continued)

OTHER PUBLICATIONS

International Search Report (PCT/ISA/210) dated Jan. 23, 2018 issued by the International Searching Authority in International Application No. PCT/JP2017/037679.
(Continued)

*Primary Examiner* — Walter H Swanson
(74) *Attorney, Agent, or Firm* — Sughrue Mion, PLLC (57) ABSTRACT

An optical wavelength conversion member including a polycrystalline ceramic sintered body containing, as main components, $Al_2O_3$ crystal grains and crystal grains of a component represented by formula $A_3B_5O_{12}$:Ce, wherein A is at least one element selected from Sc, Y and lanthanoids (except for Ce), and B is at least one element selected from Al and Ga. Further, the following relations are satisfied: $0\% \le X \le 25\%$, $9\% \le Y \le 45\%$, and $48\% \le Z \le 90\%$, wherein X represents a proportion corresponding to the ratio a/N, Y represents a proportion corresponding to the ratio b/N, and Z represents a proportion corresponding to the ratio c/N and a, b, c and N are as defined herein. Also disclosed is a light-emitting device including the optical wavelength conversion member.

9 Claims, 1 Drawing Sheet

(51) Int. Cl.
    *C09K 11/77* (2006.01)
    *C04B 35/115* (2006.01)
    *C04B 35/117* (2006.01)
    *C04B 35/44* (2006.01)
    *G02B 5/20* (2006.01)

(52) U.S. Cl.
    CPC .......... *C04B 35/44* (2013.01); *C09K 11/7774* (2013.01); *G02B 5/20* (2013.01); *H01L 33/16* (2013.01); *H01L 33/50* (2013.01); *H01L 33/501* (2013.01); *H01L 33/502* (2013.01); *H01L 33/505* (2013.01); *C04B 2235/3217* (2013.01); *C04B 2235/3222* (2013.01); *C04B 2235/3224* (2013.01); *C04B 2235/3225* (2013.01); *C04B 2235/3229* (2013.01); *C04B 2235/5436* (2013.01); *C04B 2235/5445* (2013.01); *C04B 2235/6567* (2013.01); *C04B 2235/785* (2013.01); *C04B 2235/786* (2013.01); *C04B 2235/96* (2013.01); *C04B 2235/9646* (2013.01); *C04B 2235/9661* (2013.01); *H01L 33/507* (2013.01)

(56) References Cited

U.S. PATENT DOCUMENTS

| 2010/0301739 | A1 | 12/2010 | Nakamura et al. |
| 2011/0181173 | A1 | 7/2011 | De Graaf et al. |
| 2012/0045634 | A1 | 2/2012 | Irie et al. |
| 2013/0256599 | A1 | 10/2013 | Irie |
| 2015/0247618 | A1 | 9/2015 | Irie |

FOREIGN PATENT DOCUMENTS

| JP | 5153014 | B2 | 2/2013 |
| JP | 5490407 | B2 | 5/2014 |
| JP | 5650885 | B2 | 1/2015 |
| JP | 5740017 | B2 | 6/2015 |
| JP | 2016-172837 | A | 9/2016 |
| WO | 2010/141291 | A1 | 12/2010 |

OTHER PUBLICATIONS

Extended European Search Report dated Apr. 4, 2020 for corresponding European Patent Application No. 17865718.5.
Tang et al.; "Composite phase ceramic phosphor of $Al_2O_3$-Ce: YAG for high efficiency light emitting"; Optics Express; vol. 23, No. 14; Jul. 13, 2015; pp. 17923-17928; XP002791948.

LIGHT WAVELENGTH CONVERSION MEMBER AND LIGHT EMISSION DEVICE

CROSS REFERENCE TO RELATED APPLICATIONS

This application is a National Stage of International Application No. PCT/JP2017/037679 filed on Oct. 18, 2017, which claims priority from Japanese Patent Application No. 2016-211843 filed on Oct. 28, 2016 and from Japanese Patent Application No. 2017-198555 filed Oct. 12, 2017.

TECHNICAL FIELD

The present invention relates to an optical wavelength conversion member capable of converting light wavelength, and to a light-emitting device including the optical wavelength conversion member.

BACKGROUND ART

Generally, conventional white lighting apparatuses including a light-emitting diode (LED) or a laser diode (LD) as a light source provide white light by means of a blue LED or LD in combination with a phosphor emitting light of yellow color (i.e., a complementary color of blue).

Hitherto, the matrix or material of the phosphor (or a fluorescent body) employed in such lighting apparatuses is a resin material, a glass material, or a ceramic material. In a trend for using a high-output light source in recent years, the phosphor is worked at higher temperature. Thus, ceramic phosphors having high durability have been developed.

For example, such a ceramic phosphor is generally formed of a garnet-type ceramic material represented by formula $A_3B_5O_{12}$. Among such ceramic phosphors, yttrium aluminum garnet (YAG: $Y_3Al_5O_{12}$) emits yellow fluorescence when the elemental cerium (Ce) is used as an activator.

The below-described prior art documents (Patent Documents 1 to 3) disclose a ceramic composite body exhibiting improved properties (e.g., durability), the ceramic composite body containing alumina ($Al_2O_3$) having high thermal conductivity in which YAG:Ce or $Lu_3Al_5O_{12}$:Ce (LuAG:Ce) is dispersed and deposited.

Specifically, in Patent Documents 1 to 3, the balance between color unevenness and thermal conductivity is controlled on the basis of the volume ratio of $Al_2O_3/A_3B_5O_{12}$:Ce.

For example, in Patent Document 1, the YAG:Ce content of the entire composite body is adjusted to 22 to 55 vol. %. According to Patent Document 1, a YAG:Ce content less than 22 vol. % leads to an increase in the amount of blue light transmission and occurrence of color unevenness, whereas a YAG:Ce content more than 55 vol. % leads to a decrease in thermal conductivity and a reduction in durability.

In Patent Document 2, the LuAG:Ce content is adjusted to 25 to 95 vol. %. In Patent Document 3, the $A_3B_5O_{12}$:Ce content is adjusted to 20 to 25 vol. %. According to Patent Document 3, $CeAl_{11}O_{18}$ (i.e., a Ce source) is used in an amount of 0.5 to 5 vol. % for reducing the volatilization of Ce during a firing process.

PRIOR ART DOCUMENT

Patent Document

Patent Document 1: Japanese Patent No. 5088977
Patent Document 2: Japanese Patent No. 5153014
Patent Document 3: Japanese Patent No. 5740017

SUMMARY OF THE INVENTION

Problem to be Solved by the Invention

Since in the aforementioned prior techniques a garnet fluorescent component is deposited in $Al_2O_3$ without any particular control of the crystalline structure, the volume ratio of $Al_2O_3/A_3B_5O_{12}$:Ce is used for preventing occurrence of color unevenness; i.e., for achieving high color uniformity. Thus, the resultant phosphor loses its important properties (e.g., fluorescence intensity and translucency) and thus fails to exhibit satisfactory fluorescent properties.

$CeAl_{11}O_{18}$, which is used in the technique disclosed in Patent Document 3, exhibits neither fluorescence nor translucency. Thus, incorporation of $CeAl_{11}O_{18}$ into a sintered body causes further loss of the aforementioned fluorescent properties.

In view of the foregoing, an object of the present invention is to provide an optical wavelength conversion member and a light-emitting device, each of which achieves compatibility between high fluorescence intensity and high color uniformity.

Means for Solving the Problem (1) A first aspect of the present invention is directed to an optical wavelength conversion member comprising a polycrystalline ceramic sintered body containing, as main components, $Al_2O_3$ crystal grains and crystal grains of a component represented by formula $A_3B_5O_{12}$:Ce.

In the optical wavelength conversion member, each of A and B of $A_3B_5O_{12}$ is at least one element selected from the following element groups:
A: Sc, Y, and lanthanoids (except for Ce), and
B: Al and Ga; and
the following relations are satisfied:
$0\% \leq X \leq 25\%$,
$9\% \leq Y \leq 45\%$, and
$48\% \leq Z \leq 90\%$,
wherein X represents a proportion corresponding to the ratio a/N, Y represents a proportion corresponding to the ratio b/N, and Z represents a proportion corresponding to the ratio c/N, wherein N represents the total number of $A_3B_5O_{12}$:Ce crystal grains present in a 20 μm square region of a cross section of the ceramic sintered body; a represents the number of $A_3B_5O_{12}$:Ce crystal grains present in $Al_2O_3$ crystal grains; b represents the number of $A_3B_5O_{12}$:Ce crystal grains each being present at the $Al_2O_3$ crystal grain boundary and not in contact with another $A_3B_5O_{12}$:Ce crystal grain; and c represents the number of $A_3B_5O_{12}$:Ce crystal grains each being present at the $Al_2O_3$ crystal grain boundary and in contact with one or more other $A_3B_5O_{12}$:Ce crystal grains.

Since the optical wavelength conversion member according to the first aspect has the aforementioned characteristic features, the optical wavelength conversion member achieves high fluorescence intensity and high color uniformity (i.e., low color unevenness) as shown in the Examples described hereinbelow. The optical wavelength conversion member will now be described in detail.

Since the $A_3B_5O_{12}$:Ce crystal grains satisfying the condition X are completely incorporated into $Al_2O_3$ crystal grains, volatilization of Ce can be prevented. Thus, stable fluorescence with color uniformity is achieved without causing a variation in Ce content.

A proportion X more than 25% leads to a decrease in number of $A_3B_5O_{12}$:Ce crystal grains each being independently present at an $Al_2O_3$ crystal grain boundary (corresponding to the proportion Y); hence, the effect of preventing growth of $Al_2O_3$ grains (so-called "pinning effect") is not exerted. Thus, $Al_2O_3$ grains are grown, and transmittance is lowered, resulting in low fluorescence intensity. A proportion X less than 1% tends to cause high color unevenness.

When the proportion Y falls within the aforementioned range, the pinning effect is exerted on $Al_2O_3$, and growth of $Al_2O_3$ grains is prevented. Consequently, translucency sufficient for extraction of fluorescence is achieved.

When the proportion Y is less than 9%, the pinning effect is not sufficiently exerted, and $Al_2O_3$ grains are grown, resulting in insufficient transmittance and thus low fluorescence intensity. In addition, coarsening of the grains is likely to cause color unevenness. When the proportion Y is more than 45%, optical dispersion increases at the $Al_2O_3$/$A_3B_5O_{12}$:Ce grain boundary, and translucency is lowered, resulting in low fluorescence intensity.

When the proportion Z falls within the aforementioned range, translucency sufficient for extraction of fluorescence is achieved, since no optical dispersion occurs at the aforementioned $A_3B_5O_{12}$:Ce/$A_3B_5O_{12}$:Ce grain boundary.

When the proportion Z is less than 48%, fluorescence intensity is lowered due to insufficient translucency, whereas when the proportion Z is more than 90%, the amount of transmission of excitation light increases due to excessively high translucency, resulting in occurrence of color unevenness. In addition, the connection path between $Al_2O_3$ crystal grains is less likely to be formed, and thus thermal conductivity is lowered.

Therefore, when the proportions X, Y, and Z fall within the aforementioned ranges, high fluorescence intensity and high color uniformity can be achieved.

The optical wavelength conversion member according to the first aspect, which has the aforementioned characteristic features, exhibits high thermal conductivity. Thus, even when a high-output light source is used, an undesired effect of heat on the optical wavelength conversion member can be prevented; for example, optical loss can be prevented.

Since the optical wavelength conversion member is formed of a ceramic sintered body, the optical wavelength conversion member is advantageous in that it exhibits high strength, is less likely to undergo performance degradation through repeated irradiation with light from a light source, and exhibits excellent weatherability.

(2) In a second aspect of the present invention, the ceramic sintered body contains $A_3B_5O_{12}$:Ce crystal grains in an amount of 5 to 50 vol. %.

Since the amount of $A_3B_5O_{12}$:Ce crystal grains is 5 to 50 vol. % in the second aspect, the optical wavelength conversion member is advantageous in that it exhibits sufficient fluorescence intensity as shown in the Examples described hereinbelow.

(3) In a third aspect of the present invention, the amount of Ce is 10.0 mol % or less (exclusive of 0) relative to A in $A_3B_5O_{12}$.

Since the amount of Ce is 10.0 mol % or less (exclusive of 0) relative to A in $A_3B_5O_{12}$ in the third aspect, the optical wavelength conversion member is advantageous in that it exhibits sufficient fluorescence intensity as shown in the examples described hereinbelow.

(4) In a fourth aspect of the present invention, the $Al_2O_3$ crystal grains have a mean grain size of 0.3 to 10 μm, and the $A_3B_5O_{12}$:Ce crystal grains have a mean grain size of 0.3 to 5 μm.

Since the $Al_2O_3$ crystal grains have a mean grain size of 0.3 to 10 μm, and the $A_3B_5O_{12}$:Ce crystal grains have a mean grain size of 0.3 to 5 μm in the fourth aspect, the optical wavelength conversion member is advantageous in that it exhibits sufficient fluorescence intensity and appropriate translucency as shown in the Examples described hereinbelow.

The crystal grains having the aforementioned mean grain sizes readily achieve the aforementioned crystal grain conditions; i.e., proportions X, Y, and Z defined in the first aspect.

A fifth aspect of the invention is directed to a light-emitting device having an optical wavelength conversion member as recited in any one of claims 1 to 4.

The light (i.e., fluorescence) having a wavelength converted by means of the light-emitting device (specifically, the optical wavelength conversion member) according to the fifth aspect exhibits high fluorescence intensity and high color uniformity.

The light-emitting device may include any known light-emitting element, such as LED or LD.

<Characteristic Features of the Present Invention Will Now be Described>

The aforementioned "optical wavelength conversion member" is formed of a ceramic sintered body having the aforementioned characteristics. The grain boundary between crystal grains may contain, for example, some of the components forming the crystal grains or an unavoidable impurity.

The term "main components" described above refers to any component whose crystal grains are present in a predominant amount (volume) in the optical wavelength conversion member.

The term "$A_3B_5O_{12}$:Ce" described above refers to the case where a portion of A contained in $A_3B_5O_{12}$ is substituted by Ce through formation of a solid solution. The compound having such a structure exhibits fluorescent properties.

The term "cross section of the optical wavelength conversion member" described above refers to at least one cross section of a light-transmitting portion. In the case where a plurality of (e.g., five) cross sections are observed, the cross section in which the average values satisfy the aforementioned proportions X, Y, and Z can be used. When the proportions X, Y, and Z are determined at a plurality of (e.g., five) sites in each cross section, the average values can be used.

In order to achieve the proportions X, Y, and Z falling within the aforementioned ranges, the amount of a dispersant must be appropriately determined, or a firing process must be performed under appropriate conditions as described below. For example, an excessively low firing temperature leads to a decrease in proportion X, which is not preferred. An excessively large amount of a dispersant leads to a decrease in proportion Y, whereas an excessively small amount of a dispersant leads to an increase in proportion Z. Thus, the amount of a dispersant must be appropriately determined.

MODES FOR CARRYING OUT THE INVENTION

Next will be described an embodiment of the optical wavelength conversion member and the light-emitting device of the present invention.

1. EMBODIMENT

[1-1. Structure of Optical Wavelength Conversion Member]

Figure 1:
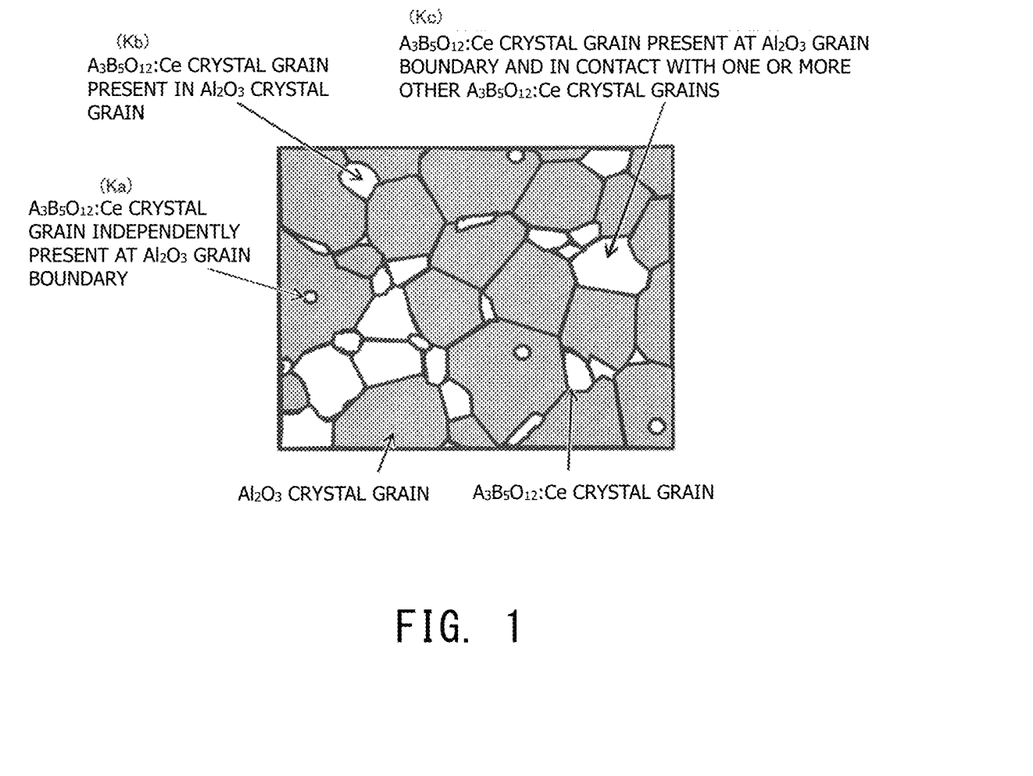
FIG. 1 Schematic view showing the crystalline structure of an optical wavelength conversion member according to an embodiment.

An optical wavelength conversion member of the embodiment will now be described. As illustrated in FIG. 1, the optical wavelength conversion member 1 (see FIG. 2) of the embodiment is formed of, for example, a plate-like ceramic sintered body formed of a polycrystalline body containing, as main components, $Al_2O_3$ crystal grains and crystal grains of a component represented by formula $A_3B_5O_{12}$:Ce (hereinafter may be referred to as "$A_3B_5O_{12}$:Ce crystal grains").

In the optical wavelength conversion member 1, each of A and B of the $A_3B_5O_{12}$ is at least one element selected from the following element groups:

A: Sc, Y, and lanthanoids (except for Ce), and
B: Al and Ga.

In addition, the following relations are satisfied:
0%≤X≤25%,
9%≤Y≤45%, and
48%≤Z≤90%,
wherein X represents a proportion corresponding to the ratio a/N, Y represents a proportion corresponding to the ratio b/N, and Z represents a proportion corresponding to the ratio c/N, wherein N represents the total number of $A_3B_5O_{12}$:Ce crystal grains present in a 20 μm square region of a cross section of the ceramic sintered body; a represents the number of $A_3B_5O_{12}$:Ce crystal grains present in $Al_2O_3$ crystal grains; b represents the number of $A_3B_5O_{12}$:Ce crystal grains each being present at an $Al_2O_3$ crystal grain boundary and not in contact with another $A_3B_5O_{12}$:Ce crystal grain; and c represents the number of $A_3B_5O_{12}$:Ce crystal grains each being present at an $Al_2O_3$ crystal grain boundary and in contact with one or more other $A_3B_5O_{12}$:Ce crystal grains.

In FIG. 1, Ka represents $A_3B_5O_{12}$:Ce crystal grains corresponding to a (thus X); i.e., $A_3B_5O_{12}$:Ce crystal grains present in $Al_2O_3$ crystal grains; Kb represents $A_3B_5O_{12}$:Ce crystal grains corresponding to b (thus Y); i.e., $A_3B_5O_{12}$:Ce crystal grains each being independently present at an $Al_2O_3$ crystal grain boundary; and Kc represents $A_3B_5O_{12}$:Ce crystal grains corresponding to c (thus Z); i.e., $A_3B_5O_{12}$:Ce crystal grains each being present at an $Al_2O_3$ crystal grain boundary and in contact with one or more other $A_3B_5O_{12}$:Ce crystal grains.

In the present embodiment, the ceramic sintered body may contain $A_3B_5O_{12}$:Ce crystal grains in an amount of 5 to 50 vol. %.

In the present embodiment, the amount of Ce may be 10.0 mol % or less (exclusive of 0) relative to A in $A_3B_5O_{12}$.

In the present embodiment, $Al_2O_3$ crystal grains may have a mean grain size of 0.3 to 10 μm, and $A_3B_5O_{12}$:Ce crystal grains may have a mean grain size of 0.3 to 5 μm.

[1-2. Structure of Light-Emitting Device]

Figure 2:
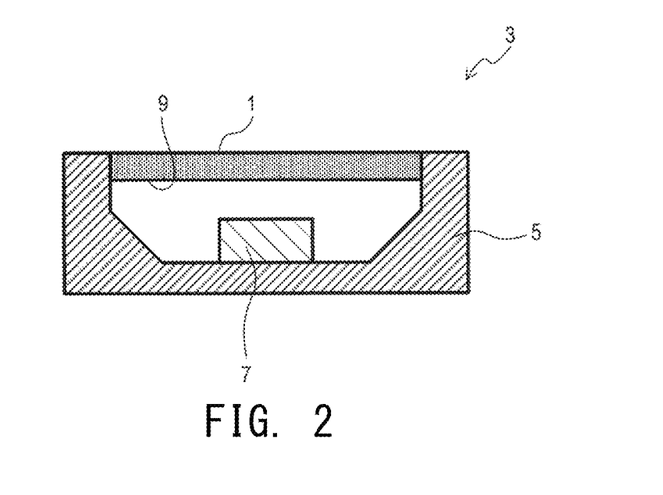
FIG. 2 Cross-sectional view of a light-emitting device in a thickness direction.

As illustrated in FIG. 2, a light-emitting device 3 includes a box-shaped ceramic package (container) 5 formed of, for example, alumina; a light-emitting element 7 (e.g., an LD) disposed in the interior of the container 5; and the plate-like optical wavelength conversion member 1 disposed so as to cover an opening 9 of the container 5.

In the light-emitting device 3, light emitted from the light-emitting element 7 transmits through the optical wavelength conversion member 1, and the wavelength of a portion of the emitted light is converted in the interior of the optical wavelength conversion member 1. Thus, the optical wavelength conversion member 1 emits fluorescence having a wavelength different from that of light emitted from the light-emitting element 7.

[1-3. Effects]

The effects of the embodiment will now be described.

In the optical wavelength conversion member 1 of the present embodiment, since, for example, the proportions X, Y, and Z are specified as described above, high fluorescence intensity and high color uniformity can be achieved.

The optical wavelength conversion member 1 of the present embodiment exhibits high thermal conductivity. Thus, even when a high-output light source is used, an undesired effect of heat on the optical wavelength conversion member 1 can be prevented; for example, optical loss can be prevented.

Since the optical wavelength conversion member 1 of the present embodiment is formed of a ceramic sintered body, the optical wavelength conversion member 1 is advantageous in that it exhibits high strength, is less likely to undergo performance degradation through repeated irradiation with light from a light source, and exhibits excellent weatherability.

In the case where the amount of $A_3B_5O_{12}$:Ce crystal grains is 5 to 50 vol. %, the optical wavelength conversion member 1 is advantageous in that it exhibits sufficient fluorescence intensity.

In the case where the amount of Ce is 10.0 mol % or less (exclusive of 0) relative to A in $A_3B_5O_{12}$, the optical wavelength conversion member 1 is advantageous in that it exhibits sufficient fluorescence intensity.

In the case where $Al_2O_3$ crystal grains have a mean grain size of 0.3 to 10 μm, and $A_3B_5O_{12}$:Ce crystal grains have a mean grain size of 0.3 to 5 μm, the optical wavelength conversion member 1 is advantageous in that it exhibits sufficient fluorescence intensity and appropriate translucency.

Thus, the light-emitting device 3 including the optical wavelength conversion member 1 can effectively emit fluorescence with high fluorescence intensity and high color uniformity.

2. EXAMPLES

Specific examples will next be described.

Example 1

Ceramic sintered body samples (Nos. 1 to 9) were prepared under the conditions shown in Tables 1 and 2. Samples Nos. 1 to 9 fall within the scope of the present invention.

Specifically, for preparation of each sample, $Al_2O_3$ powder (mean particle size: 0.3 μm), $Y_2O_3$ powder (mean particle size: 1.2 μm), and $CeO_2$ powder (mean particle size: 1.5 μm) were weighed so that the amount of YAG ($Y_3Al_5O_{12}$) was 21 vol. % in a ceramic sintered body (i.e., a ceramic sintered body forming an optical wavelength conversion member), and the Ce content was 1 mol % relative to Y in YAG.

These powders were added to a ball mill together with pure water and a specific amount of a dispersant (2 wt. % in terms of solid content, relative to the raw material powders), and these materials were grind-mixed for 12 hours. The resultant slurry was dried and granulated, and the resultant granular product was formed into a compact. The compact was fired in air at ambient pressure and at 1,450° C. to 1,750° C. for 3 to 20 hours. Thus, ceramic sintered body samples Nos. 1 to 9 (e.g., plate-like samples) were prepared.

Examples of the usable dispersant include polycarboxylate dispersants, such as SN Dispersant 5468 (product of San Nopco Limited) and MALIALIM AKM-0531 (product of NOF Corporation).

Subsequently, the prepared ceramic sintered bodies were examined in terms of the following properties (a) to (f) in the same manner as in other examples described below. The results are shown in Table 2.

(a) Relative Density

The relative density of each ceramic sintered body was measured by the Archimedes method, and the measured density was converted into a relative density.

(b) Mean Crystal Grain Size

Each sample was subjected to mirror polishing and subsequent thermal etching at 1,300° C. The etched surface was observed under a scanning electron microscope (i.e., SEM observation), to thereby prepare an image (magnification: 5,000) at a certain position of the ceramic sintered body. In the case where the sample is in the shape of, for example, rectangular plate, the position corresponds to a light-transmitting portion; i.e., a center portion (in plan view) as viewed in a thickness direction.

A line was drawn in a 20 μm square region of the image at the aforementioned position (see, for example, FIG. 1), and the intercept method was used to determine the mean crystal grain sizes of $Al_2O_3$ crystal grains and that of $A_3B_5O_{12}$:Ce crystal grains.

(c) Grain Proportions X, Y, and Z

In the same manner as in (b) described above, the sample was subjected to mirror polishing and subsequent thermal etching at 1,300° C. The etched surface was subjected to SEM observation, to thereby prepare an image (magnification: 5,000) at a certain position of the ceramic sintered body. The number of grains (a, b, or c) was counted in a 20 μm square region of the image, to thereby calculate a proportion X, Y, or Z. The aforementioned treatment was performed in five visual fields, and the proportions X, Y, or Z were averaged. The polished surface corresponds to the "cross section" as used herein.

(d) Fluorescence Intensity

Each sample was processed into a shape of 13 mm×13 mm×0.5 mm (thickness). Blue LD light (wavelength: 465 nm) was focused to a width of 0.5 mm by means of a lens, and the processed sample was irradiated with the focused light. The light transmitting through the sample was focused by means of a lens, and the emission intensity was measured by means of a power sensor. The sample was irradiated with the light at a power density 40 W/mm². The emission intensity was evaluated by a value relative to that (taken as 100) of a YAG:Ce single-crystal body.

(e) Color Unevenness

Color unevenness (i.e., variation in color) was evaluated through determination of a variation in chromaticity by means of an illuminometer. Each sample was processed into a shape of 20 mm×20 mm×0.5 mm (thickness). Blue LD light (wavelength: 465 nm) was focused to a width of 0.5 mm by means of a lens, and the processed sample was irradiated with the focused light. A color illuminometer was used to determine the chromaticity of the light transmitting through the surface of the sample opposite the surface irradiated with the focused light.

The light irradiation was performed on a 18 mm square region (at intervals of 3 mm in the region) at the center of the irradiation surface of the sample (sample surface), and a variation ($\Delta X$) in chromaticity (in X-direction) was evaluated. As used herein, the term "variation ($\Delta X$)" refers to the maximum deviation of chromaticity (in X-direction)

The term "chromaticity" as used herein refers to a chromaticity indicated by the CIE-XYZ color system established by the International Commission on Illumination (CIE) in 1931. Specifically, the chromaticity is indicated by the xy chromaticity diagram (so-called CIE chromaticity diagram) wherein three primary colors of light are digitized and represented in an xy coordinate space.

(f) Thermal Conductivity

Each sample was processed into a shape of 10 mm×10 mm×2 mm (thickness), and the thermal conductivity of the sample was measured. Specifically, thermal conductivity was measured according to JIS R1611.

The above-determined fluorescence intensity, color unevenness, and thermal conductivity of each sample can be evaluated on the basis of the following criteria. Samples of other examples can be evaluated in the same manner.

Criteria for evaluation of fluorescence intensity are as follows: 110 or more (preferred), 100 or more and less than 110 (somewhat preferred), and less than 100 (not preferred). Criteria for evaluation of color unevenness are as follows: $\Delta X<0.02$ (preferred), $0.02\leq\Delta X<0.06$ (somewhat preferred), and $0.06\leq\Delta X$ (not preferred).

Criteria for evaluation of thermal conductivity are as follows: 20 W/m·K or more (preferred), and less than 20 W/m·K (not preferred).

The samples of Example 1 were evaluated on the basis of the aforementioned criteria. Next will be described the results.

All the samples of Example 1 exhibited a relative density of 99% or more; i.e., the samples were sufficiently densified. The mean crystal grain size of $Al_2O_3$ (abbreviated as "$Al_2O_3$ grain size" in Table 2) was found to fall within a range of 0.3 to 10 μm, and the mean crystal grain size of $A_3B_5O_{12}$:Ce (YAG:Ce) (abbreviated as "$A_3B_5O_{12}$ grain size" in Table 2) was found to fall within a range of 0.3 to 5 μm.

Samples Nos. 3 to 9, in which X, Y, and Z fall within the scope of the present invention, exhibited good results in terms of fluorescence intensity, color unevenness, and thermal conductivity. Samples Nos. 1 and 2, which fall within the scope of the present invention (note: the firing temperature is lower than that for the other samples), exhibited color unevenness higher than that of samples Nos. 3 to 9.

Example 2

As shown in Tables 1 and 2, ceramic sintered body samples (samples Nos. 10 to 15) were prepared and evaluated in the same manner as in Example 1.

However, the amount of a dispersant was changed to fall within a range of 1.8 to 5 wt. % during mixing of the raw materials. The firing time was changed within a range of 5 to 20 hours.

Samples Nos. 11 to 14 fall within the scope of the present invention, and samples Nos. 10 and 15 (Comparative Examples) fall outside the scope of the present invention.

All the samples exhibited a relative density of 99% or more; i.e., the samples were sufficiently densified. Except for the case of sample No. 10, the mean crystal grain size of $Al_2O_3$ was found to fall within a range of 0.3 to 10 μm, and the mean crystal grain size of $A_3B_5O_{12}$:Ce (YAG:Ce) was found to fall within a range of 0.3 to 5 μm. As shown in Table 2, samples Nos. 11 to 14, in which X, Y, and Z fall within the scope of the present invention, exhibited good results in terms of fluorescence intensity, color unevenness, and thermal conductivity. In sample No. 10 (lower Y), the mean crystal grain size of $Al_2O_3$ was 11 μm (slightly coarse), the fluorescence intensity was slightly low, and the color unevenness was high. In sample No. 15 (higher Y and lower Z), the fluorescence intensity was less than 100.

Example 3

As shown in Tables 1 and 2, ceramic sintered body samples (samples Nos. 16 to 20) were prepared and evaluated in the same manner as in Example 1.

The amount of a dispersant was changed to fall within a range of 0 to 1.5 wt. % during mixing of the raw materials.

Samples Nos. 16 to 19 fall within the scope of the present invention, and sample No. 20 (Comparative Example) falls outside the scope of the present invention.

All the samples exhibited a relative density of 99% or more; i.e., the samples were sufficiently densified. The mean crystal grain size of $Al_2O_3$ was found to fall within a range of 0.3 to 10 μm, and the mean crystal grain size of $A_3B_5O_{12}$:Ce (YAG:Ce) was found to fall within a range of 0.3 to 5 μm.

As shown in Table 2, samples Nos. 16 to 19, in which X, Y, and Z fall within the scope of the present invention, exhibited good results in terms of fluorescence intensity, color unevenness, and thermal conductivity. In sample No. 20 (lower Y and higher Z), the fluorescence intensity was slightly low, the color unevenness was high, and the thermal conductivity was low.

Example 4

As shown in Tables 1 and 2, ceramic sintered body samples (samples Nos. 21 to 28 falling within the scope of the present invention) were prepared and evaluated in the same manner as in Example 1.

The proportions of the raw materials were changed so that the amount of $A_3B_5O_{12}$:Ce (amount of YAG:Ce) in the ceramic sintered body was adjusted to 1 to 60 vol. %.

All the samples exhibited a relative density of 99% or more; i.e., the samples were sufficiently densified. The mean crystal grain size of $Al_2O_3$ was found to fall within a range of 0.3 to 10 μm, and the mean crystal grain size of $A_3B_5O_{12}$:Ce (YAG:Ce) was found to fall within a range of 0.3 to 5 μm.

As shown in Table 2, samples Nos. 23 to 27, in which the YAG:Ce content falls within a specific range (i.e., 5 to 50 vol. %), exhibited good results in terms of fluorescence intensity, color unevenness, and thermal conductivity. In samples Nos. 21 and 22 (lower YAG:Ce content), the fluorescence intensity was slightly low, and the color unevenness was slightly high. In sample No. 28 (higher YAG:Ce content), the fluorescence intensity was slightly low, and the thermal conductivity was low.

Example 5

As shown in Tables 1 and 2, ceramic sintered body samples (samples Nos. 29 to 38 falling within the scope of the present invention) were prepared and evaluated in the same manner as in Example 1.

The proportions of the raw materials were varied so that the Ce content was 0 to 15 mol % relative to Y in $A_3B_5O_{12}$ (YAG) of the sintered body.

All the samples exhibited a relative density of 99% or more; i.e., the samples were sufficiently densified. The mean crystal grain size of $Al_2O_3$ was found to fall within a range of 0.3 to 10 μm, and the mean crystal grain size of $A_3B_5O_{12}$:Ce (YAG:Ce) was found to fall within a range of 0.3 to 5 μm.

As shown in Table 2, samples Nos. 30 to 37, in which the Ce content falls within a specific range (i.e., 10.0 mol % or less (exclusive of 0)), exhibited good results in terms of fluorescence intensity, color unevenness, and thermal conductivity. In sample No. 29 (free of Ce), neither the fluorescence intensity nor the color unevenness was determined. In sample No. 38 (higher Ce content), the fluorescence intensity was slightly low.

Example 6

As shown in Tables 1 and 2, ceramic sintered body samples (samples Nos. 39 to 59 falling within the scope of the present invention) were prepared and evaluated in the same manner as in Example 1.

$Y_2O_3$ powder was used in combination with at least one of $Lu_2O_3$ powder (mean particle size: 1.3 μm), $Yb_2O_3$ powder (mean particle size: 1.5 μm), $Gd_2O_3$ powder (mean particle size: 1.5 μm), $Tb_2O_3$ powder (mean particle size: 1.6 μm), and $Ga_2O_3$ powder (mean particle size: 1.3 μm). During mixing of the raw materials, the proportions of the raw materials were varied so that specific $A_3B_5O_{12}$:Ce was synthesized.

All the samples exhibited a relative density of 99% or more; i.e., the samples were sufficiently densified. The mean crystal grain size of $Al_2O_3$ was found to fall within a range of 0.3 to 10 μm, and the mean crystal grain size of $A_3B_5O_{12}$:Ce (YAG:Ce) was found to fall within a range of 0.3 to 5 μm.

All the ceramic sintered bodies exhibited good results in terms of fluorescence intensity, color unevenness, and thermal conductivity.

TABLE 1

| Example | No. | $A_3B_5O_{12}$ composition | Dispersant content (wt %) | Firing temperature (° C.) | Firing time (hr) |
|---|---|---|---|---|---|
| 1 | 1 | $Y_3Al_5O_{12}$ | 2 | 1450 | 10 |
|   | 2 | $Y_3Al_5O_{12}$ | 2 | 1500 | 10 |
|   | 3 | $Y_3Al_5O_{12}$ | 2 | 1550 | 3 |
|   | 4 | $Y_3Al_5O_{12}$ | 2 | 1550 | 10 |
|   | 5 | $Y_3Al_5O_{12}$ | 2 | 1550 | 20 |
|   | 6 | $Y_3Al_5O_{12}$ | 2 | 1600 | 10 |
|   | 7 | $Y_3Al_5O_{12}$ | 2 | 1650 | 10 |
|   | 8 | $Y_3Al_5O_{12}$ | 2 | 1700 | 10 |
|   | 9 | $Y_3Al_5O_{12}$ | 2 | 1750 | 10 |
| 2 | 10 | $Y_3Al_5O_{12}$ | 5 | 1600 | 20 |
|   | 11 | $Y_3Al_5O_{12}$ | 4.5 | 1600 | 20 |
|   | 12 | $Y_3Al_5O_{12}$ | 4 | 1600 | 10 |
|   | 13 | $Y_3Al_5O_{12}$ | 3.5 | 1600 | 5 |
|   | 14 | $Y_3Al_5O_{12}$ | 3 | 1600 | 5 |
|   | 15 | $Y_3Al_5O_{12}$ | 1.8 | 1600 | 5 |

TABLE 1-continued

| Example | No. | $A_3B_5O_{12}$ composition | Dispersant content (wt %) | Firing temperature (° C.) | Firing time (hr) |
|---|---|---|---|---|---|
| 3 | 16 | $Y_3Al_5O_{12}$ | 1.5 | 1600 | 10 |
| | 17 | $Y_3Al_5O_{12}$ | 1.2 | 1600 | 10 |
| | 18 | $Y_3Al_5O_{12}$ | 0.8 | 1600 | 10 |
| | 19 | $Y_3Al_5O_{12}$ | 0.3 | 1600 | 10 |
| | 20 | $Y_3Al_5O_{12}$ | 0 | 1600 | 10 |
| 4 | 21 | $Y_3Al_5O_{12}$ | 2 | 1600 | 20 |
| | 22 | $Y_3Al_5O_{12}$ | 2 | 1600 | 20 |
| | 23 | $Y_3Al_5O_{12}$ | 2 | 1600 | 20 |
| | 24 | $Y_3Al_5O_{12}$ | 2 | 1600 | 20 |
| | 25 | $Y_3Al_5O_{12}$ | 2 | 1600 | 20 |
| | 26 | $Y_3Al_5O_{12}$ | 2 | 1600 | 20 |
| | 27 | $Y_3Al_5O_{12}$ | 2 | 1600 | 20 |
| | 28 | $Y_3Al_5O_{12}$ | 3 | 1600 | 20 |
| 5 | 29 | $Y_3Al_5O_{12}$ | 2 | 1600 | 20 |
| | 30 | $Y_3Al_5O_{12}$ | 2 | 1600 | 20 |
| | 31 | $Y_3Al_5O_{12}$ | 2 | 1600 | 20 |
| | 32 | $Y_3Al_5O_{12}$ | 2 | 1600 | 20 |
| | 33 | $Y_3Al_5O_{12}$ | 2 | 1600 | 20 |
| | 34 | $Y_3Al_5O_{12}$ | 2 | 1600 | 20 |
| | 35 | $Y_3Al_5O_{12}$ | 2 | 1600 | 20 |
| | 36 | $Y_3Al_5O_{12}$ | 2 | 1600 | 20 |
| | 37 | $Y_3Al_5O_{12}$ | 2 | 1600 | 20 |
| | 38 | $Y_3Al_5O_{12}$ | 2 | 1600 | 20 |
| 6 | 39 | $Lu_3Al_5O_{12}$ | 2 | 1600 | 20 |
| | 40 | $Lu_3Al_5O_{12}$ | 2 | 1600 | 20 |
| | 41 | $Lu_3Al_5O_{12}$ | 2 | 1600 | 20 |
| | 42 | $Y_{1.5}Lu_{1.5}Al_5O_{12}$ | 2 | 1600 | 20 |
| | 43 | $Y_{1.5}Lu_{1.5}Al_5O_{12}$ | 2 | 1600 | 20 |
| | 44 | $Y_{1.5}Lu_{1.5}Al_5O_{12}$ | 2 | 1600 | 20 |
| | 45 | $Yb_3Al_5O_{12}$ | 2 | 1600 | 20 |
| | 46 | $Yb_3Al_5O_{12}$ | 2 | 1600 | 20 |
| | 47 | $Yb_3Al_5O_{12}$ | 2 | 1600 | 20 |
| | 48 | $Y_{1.5}Yb_{1.5}Al_5O_{12}$ | 2 | 1600 | 20 |
| | 49 | $Y_{1.5}Yb_{1.5}Al_5O_{12}$ | 2 | 1600 | 20 |
| | 50 | $Y_{1.5}Yb_{1.5}Al_5O_{12}$ | 2 | 1600 | 20 |
| | 51 | $Y_{1.5}Gd_{1.5}Al_5O_{12}$ | 2 | 1600 | 20 |
| | 52 | $Y_{1.5}Gd_{1.5}Al_5O_{12}$ | 2 | 1600 | 20 |
| | 53 | $Y_{1.5}Gd_{1.5}Al_5O_{12}$ | 2 | 1600 | 20 |
| | 54 | $Y_{1.5}Tb_{1.5}Al_5O_{12}$ | 2 | 1600 | 20 |
| | 55 | $Y_{1.5}Tb_{1.5}Al_5O_{12}$ | 2 | 1600 | 20 |
| | 56 | $Y_{1.5}Tb_{1.5}Al_5O_{12}$ | 2 | 1600 | 20 |
| | 57 | $Y_3Al_4Ga_1O_{12}$ | 2 | 1600 | 20 |
| | 58 | $Y_3Al_4Ga_1O_{12}$ | 2 | 1600 | 20 |
| | 59 | $Y_3Al_4Ga_1O_{12}$ | 2 | 1600 | 20 |

TABLE 2

| Example | No. | X (%) | Y (%) | Z (%) | $Al_2O_3$ content (vol. %) | $A_3B_5O_{12}$:Ce content (vol. %) | Ce content (mol %) | Fluorescence intensity | Color unevenness (ΔX) | Thermal conductivity (W/mK) | $Al_2O_3$ grain size | $A_3B_5O_{12}$ grain size |
|---|---|---|---|---|---|---|---|---|---|---|---|---|
| 1 | 1 | 0 | 14.3 | 85.7 | 79 | 21 | 1 | 115 | 0.05 | 21.5 | 0.8 | 0.4 |
| | 2 | 0.2 | 15.1 | 84.7 | 79 | 21 | 1 | 114 | 0.032 | 24.6 | 0.9 | 0.4 |
| | 3 | 1.1 | 14.2 | 84.7 | 79 | 21 | 1 | 120 | 0.018 | 24.9 | 1.2 | 0.5 |
| | 4 | 3.5 | 18.7 | 77.8 | 79 | 21 | 1 | 121 | 0.015 | 25.1 | 1.5 | 0.5 |
| | 5 | 4.9 | 20.1 | 75 | 79 | 21 | 1 | 117 | 0.014 | 25.3 | 1.6 | 0.7 |
| | 6 | 9.3 | 23.3 | 67.4 | 79 | 21 | 1 | 114 | 0.013 | 25.9 | 1.7 | 0.8 |
| | 7 | 14.6 | 25.6 | 59.8 | 79 | 21 | 1 | 112 | 0.013 | 26.9 | 2.1 | 1 |
| | 8 | 17.5 | 27.8 | 54.7 | 79 | 21 | 1 | 111 | 0.012 | 27.5 | 3.2 | 1.4 |
| | 9 | 20.5 | 30.3 | 49.2 | 79 | 21 | 1 | 110 | 0.011 | 28.2 | 5.1 | 1.9 |
| 2 | 10 | 11.5 | 8.8 | 79.7 | 79 | 21 | 1 | 108 | 0.032 | 25.3 | 11 | 3.5 |
| | 11 | 8.0 | 10.5 | 81.5 | 79 | 21 | 1 | 114 | 0.019 | 24.9 | 6.5 | 2.8 |
| | 12 | 3.2 | 21.0 | 75.8 | 79 | 21 | 1 | 119 | 0.015 | 26.1 | 3.1 | 1.5 |
| | 13 | 2.5 | 33.5 | 64.0 | 79 | 21 | 1 | 113 | 0.013 | 26.3 | 2.5 | 1.2 |
| | 14 | 2.1 | 42.1 | 55.8 | 79 | 21 | 1 | 111 | 0.012 | 27.8 | 1.8 | 0.8 |
| | 15 | 1.8 | 46.5 | 47.5 | 79 | 21 | 1 | 95 | 0.013 | 28.2 | 1.5 | 0.7 |
| 3 | 16 | 8.9 | 39.9 | 51.2 | 79 | 21 | 1 | 111 | 0.01 | 27.3 | 1.9 | 0.8 |
| | 17 | 7.8 | 27.2 | 65.0 | 79 | 21 | 1 | 118 | 0.014 | 26 | 2.3 | 1 |
| | 18 | 7.3 | 12.4 | 80.3 | 79 | 21 | 1 | 113 | 0.013 | 24.7 | 3.1 | 1.3 |
| | 19 | 2.3 | 9.1 | 88.6 | 79 | 21 | 1 | 110 | 0.018 | 21.6 | 4.1 | 1.7 |
| | 20 | 1.8 | 4.7 | 93.5 | 79 | 21 | 1 | 105 | 0.031 | 18.5 | 5 | 2 |
| 4 | 21 | 26.3 | 68.0 | 5.7 | 99 | 1 | 1 | 90 | 0.08 | 28.6 | 10 | 0.3 |
| | 22 | 17.8 | 28.1 | 54.1 | 97 | 3 | 1 | 103 | 0.021 | 27.4 | 7.5 | 3.1 |
| | 23 | 15.1 | 27.3 | 57.7 | 95 | 5 | 1 | 110 | 0.018 | 26.7 | 5.5 | 2.2 |
| | 24 | 9.3 | 25.1 | 65.6 | 90 | 10 | 1 | 113 | 0.015 | 25 | 3.6 | 1.9 |
| | 25 | 7.6 | 20.1 | 72.3 | 75 | 25 | 1 | 116 | 0.013 | 24.5 | 1.6 | 0.8 |
| | 26 | 2.2 | 16.4 | 81.4 | 70 | 30 | 1 | 119 | 0.012 | 24.1 | 1.5 | 0.7 |
| | 27 | 1.5 | 13.5 | 85.0 | 50 | 50 | 1 | 113 | 0.011 | 22.1 | 1.7 | 0.8 |
| | 28 | 1.2 | 11.6 | 87.2 | 40 | 60 | 1 | 107 | 0.01 | 19 | 2.1 | 0.9 |
| 5 | 29 | 2.8 | 20.1 | 77.1 | 79 | 21 | 0 | — | — | 26.2 | 1.9 | 0.8 |
| | 30 | 2.9 | 21 | 76.1 | 79 | 21 | 0.03 | 110 | 0.019 | 26 | 1.8 | 0.8 |
| | 31 | 3.2 | 22 | 74.8 | 79 | 21 | 0.3 | 111 | 0.018 | 26.9 | 1.9 | 0.7 |
| | 32 | 3 | 20.5 | 76.5 | 79 | 21 | 0.45 | 113 | 0.016 | 26.5 | 1.9 | 0.8 |
| | 33 | 2.6 | 19.9 | 77.5 | 79 | 21 | 0.5 | 117 | 0.014 | 25.9 | 2 | 0.9 |
| | 34 | 2.1 | 18.7 | 79.2 | 79 | 21 | 1 | 118 | 0.012 | 24.5 | 2.1 | 0.9 |
| | 35 | 2.8 | 18 | 79.2 | 79 | 21 | 3 | 117 | 0.013 | 25.5 | 1.8 | 0.7 |
| | 36 | 3.3 | 18.8 | 77.9 | 79 | 21 | 5 | 116 | 0.013 | 25.8 | 1.7 | 0.6 |
| | 37 | 3.6 | 20.5 | 75.9 | 79 | 21 | 10 | 111 | 0.011 | 26.7 | 1.8 | 0.7 |
| | 38 | 3.1 | 19.5 | 77.4 | 79 | 21 | 15 | 103 | 0.014 | 25 | 1.9 | 0.7 |
| 6 | 39 | 3.5 | 21 | 75.5 | 90 | 10 | 1 | 112 | 0.012 | 27.9 | 3.1 | 1.5 |
| | 40 | 2.5 | 23.5 | 74 | 79 | 21 | 1 | 115 | 0.015 | 26.5 | 1.8 | 0.8 |
| | 41 | 2.8 | 26.1 | 71.1 | 70 | 30 | 1 | 118 | 0.016 | 25.8 | 1.5 | 1.2 |
| | 42 | 4 | 20.7 | 75.3 | 90 | 10 | 1 | 111 | 0.015 | 28.4 | 3.2 | 1.4 |
| | 43 | 3.1 | 24 | 72.9 | 79 | 21 | 1 | 113 | 0.018 | 27.1 | 1.7 | 0.9 |
| | 44 | 2.6 | 19.9 | 77.5 | 70 | 30 | 1 | 116 | 0.01 | 25.6 | 1.5 | 1.2 |

TABLE 2-continued

| Example | No. | X (%) | Y (%) | Z (%) | $Al_2O_3$ content (vol. %) | $A_3B_5O_{12}$:Ce content (vol. %) | Ce content (mol %) | Fluorescence intensity | Color unevenness ($\Delta X$) | Thermal conductivity (W/mK) | $Al_2O_3$ grain size | $A_3B_5O_{12}$ grain size |
|---|---|---|---|---|---|---|---|---|---|---|---|---|
| | 45 | 2.9 | 23.5 | 73.6 | 90 | 10 | 1 | 114 | 0.012 | 28 | 3.3 | 1.3 |
| | 46 | 2.4 | 18.7 | 78.9 | 79 | 21 | 1 | 114 | 0.014 | 26.5 | 1.9 | 0.8 |
| | 47 | 1.9 | 23.5 | 74.6 | 70 | 30 | 1 | 119 | 0.015 | 24.9 | 1.6 | 1.1 |
| | 48 | 1.8 | 23.9 | 74.3 | 90 | 10 | 1 | 112 | 0.017 | 27.5 | 3.5 | 1.6 |
| | 49 | 2.4 | 24.6 | 73 | 79 | 21 | 1 | 115 | 0.013 | 26 | 1.9 | 0.8 |
| | 50 | 2.7 | 28 | 69.3 | 70 | 30 | 1 | 118 | 0.012 | 23.9 | 1.5 | 1.3 |
| | 51 | 2 | 21.9 | 76.1 | 90 | 10 | 1 | 114 | 0.01 | 27 | 2.9 | 1.3 |
| | 52 | 2.5 | 23.5 | 74 | 79 | 21 | 1 | 116 | 0.01 | 25.9 | 1.7 | 0.7 |
| | 53 | 3.5 | 24.3 | 72.2 | 70 | 30 | 1 | 118 | 0.016 | 24.9 | 1.4 | 1.2 |
| | 54 | 3.1 | 28.1 | 70.8 | 90 | 10 | 1 | 113 | 0.014 | 28.2 | 3 | 1.5 |
| | 55 | 3 | 24 | 73 | 79 | 21 | 1 | 113 | 0.011 | 26.3 | 1.6 | 0.8 |
| | 56 | 2.9 | 27 | 70.1 | 70 | 30 | 1 | 115 | 0.019 | 25.7 | 1.5 | 1.2 |
| | 57 | 2.4 | 24.6 | 73 | 90 | 10 | 1 | 110 | 0.014 | 27.9 | 3.1 | 1.3 |
| | 58 | 3.3 | 25.3 | 71.4 | 79 | 21 | 1 | 112 | 0.017 | 26 | 1.8 | 0.9 |
| | 59 | 2.9 | 21 | 76.1 | 70 | 30 | 1 | 115 | 0.012 | 25.1 | 1.4 | 1.2 |

3. OTHER EMBODIMENTS

Needless to say, the present invention is not limited to the aforementioned embodiment, but may be implemented in various other forms without departing from the scope of the invention.

(1) For example, the aforementioned embodiment involves the use of a firing process performed in air at ambient pressure. However, a vacuum firing process, a reducing-atmosphere firing process, a hot pressing (HP) process, a hot isostatic pressing (HIP) process, or any combination of these processes may be used for the preparation of a sample having the same properties as those described in the embodiment.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) In the aforementioned embodiment, the function of a single component may be shared by a plurality of components, or a single component may exert the functions of a plurality of components. Some of the components in the aforementioned embodiment may be omitted. At least some of the components in the aforementioned embodiment may be, for example, added to or replaced with components in another embodiment. Embodiments of the present invention encompass any form included in technical ideas specified by the appended claims.

DESCRIPTION OF REFERENCE NUMERALS

1: optical wavelength conversion member; 3: light-emitting device; and 7: light-emitting element

The invention claimed is:

1. An optical wavelength conversion member comprising a polycrystalline ceramic sintered body containing, as main components, $Al_2O_3$ crystal grains and crystal grains of a component represented by formula $A_3B_5O_{12}$:Ce, the optical wavelength conversion member being characterized in that:
each of A and B of the $A_3B_5O_{12}$ is at least one element selected from the following element groups:
A: Sc, Y, and lanthanoids (except for Ce), and
B: Al and Ga; and
the following relations are satisfied:
0%≤X≤25%,
9%≤Y≤45%, and
48%≤Z≤90%,
wherein X represents a proportion corresponding to the ratio a/N, Y represents a proportion corresponding to the ratio b/N, and Z represents a proportion corresponding to the ratio c/N, wherein N represents the total number of $A_3B_5O_{12}$:Ce crystal grains present in a 20 μm square region of a cross section of the ceramic sintered body; a represents the number of $A_3B_5O_{12}$:Ce crystal grains present in $Al_2O_3$ crystal grains; b represents the number of $A_3B_5O_{12}$:Ce crystal grains each being present at an $Al_2O_3$ crystal grain boundary and not in contact with another $A_3B_5O_{12}$:Ce crystal grain; and c represents the number of $A_3B_5O_{12}$:Ce crystal grains each being present at an $Al_2O_3$ crystal grain boundary and in contact with one or more other $A_3B_5O_{12}$:Ce crystal grains.

2. An optical wavelength conversion member according to claim 1, wherein the ceramic sintered body contains the $A_3B_5O_{12}$:Ce crystal grains in an amount of 5 to 50 vol. %.

3. An optical wavelength conversion member according to claim 1, wherein the amount of Ce is 10.0 mol % or less (exclusive of 0) relative to A in the $A_3B_5O_{12}$.

4. An optical wavelength conversion member according to claim 1, wherein the $Al_2O_3$ crystal grains have a mean grain size of 0.3 to 10 μm, and the $A_3B_5O_{12}$:Ce crystal grains have a mean grain size of 0.3 to 5 μm.

5. A light-emitting device characterized by comprising the optical wavelength conversion member as recited in claim 1.

6. An optical wavelength conversion member comprising a polycrystalline ceramic sintered body containing, as main components, $Al_2O_3$ crystal grains and crystal grains of a component represented by formula $A_3B_5O_{12}$:Ce, the optical wavelength conversion member being characterized in that:
each of A and B of the $A_3B_5O_{12}$ is at least one element selected from the following element groups:
A: Sc, Y, and lanthanoids (except for Ce), and
B: Al and Ga; and
the following relations are satisfied:
0%≤X≤25%,
9%≤Y≤45%, and
48%≤Z≤90%,
wherein X represents a proportion corresponding to the ratio a/N, Y represents a proportion corresponding to the ratio b/N, and Z represents a proportion corresponding to the ratio c/N, wherein N represents the total number of $A_3B_5O_{12}$:Ce crystal grains present in a 20 μm square region of a cross section of the ceramic sintered body; a represents the number of $A_3B_5O_{12}$:Ce crystal grains present in the $Al_2O_3$ crystal grains; b represents the number of $A_3B_5O_{12}$:Ce crystal grains each being present at an $Al_2O_3$ crystal grain boundary and not in contact with another $A_3B_5O_{12}$:Ce crystal grain; and c represents the number of $A_3B_5O_{12}$:Ce crystal grains each being present at an $Al_2O_3$ crystal grain boundary and in contact with one or more other $A_3B_5O_{12}$:Ce crystal grains, wherein the ceramic sintered body contains the $A_3B_5O_{12}$:Ce crystal grains in an amount of 5 to 50 vol. %, and wherein the amount of Ce is 10.0 mol % or less (exclusive of 0) relative to A in the $A_3B_5O_{12}$.

7. A light-emitting device characterized by comprising the optical wavelength conversion member as recited in claim 6.

8. An optical wavelength conversion member comprising a polycrystalline ceramic sintered body containing, as main components, $Al_2O_3$ crystal grains and crystal grains of a component represented by formula $A_3B_5O_{12}$:Ce, the optical wavelength conversion member being characterized in that:

each of A and B of the $A_3B_5O_{12}$ is at least one element selected from the following element groups:

A: Sc, Y, and lanthanoids (except for Ce), and

B: Al and Ga; and the following relations are satisfied:

$0\% \leq X \leq 25\%$, $9\% \leq Y \leq 45\%$, and $48\% \leq Z \leq 90\%$, wherein X represents a proportion corresponding to the ratio a/N, Y represents a proportion corresponding to the ratio b/N, and Z represents a proportion corresponding to the ratio c/N, wherein N represents the total number of $A_3B_5O_{12}$:Ce crystal grains present in a 20 µm square region of a cross section of the ceramic sintered body; a represents the number of $A_3B_5O_{12}$:Ce crystal grains present in the $Al_2O_3$ crystal grains; b represents the number of $A_3B_5O_{12}$:Ce crystal grains each being present at an $Al_2O_3$ crystal grain boundary and not in contact with another $A_3B_5O_{12}$:Ce crystal grain; and c represents the number of $A_3B_5O_{12}$:Ce crystal grains each being present at an $Al_2O_3$ crystal grain boundary and in contact with one or more other $A_3B_5O_{12}$:Ce crystal grains, wherein the ceramic sintered body contains the $A_3B_5O_{12}$:Ce crystal grains in an amount of 5 to 50 vol. %, wherein the amount of Ce is 10.0 mol % or less (exclusive of 0) relative to A in the $A_3B_5O_{12}$, and wherein the $Al_2O_3$ crystal grains have a mean grain size of 0.3 to 5 µm.

9. A light-emitting device characterized by comprising the optical wavelength conversion member as recited in claim 8.

* * * * *